(12) United States Patent
Nandakumar et al.

(10) Patent No.: US 8,753,944 B2
(45) Date of Patent: Jun. 17, 2014

(54) POCKET COUNTERDOPING FOR GATE-EDGE DIODE LEAKAGE REDUCTION

(71) Applicant: Texas Instruments Incorporated, Dallas, TX (US)

(72) Inventors: Mahalingam Nandakumar, Richardson, TX (US); Brian Hornung, Richardson, TX (US); Terry James Bordelon, Jr., Flower Mound, TX (US); Amitava Chatterjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/766,847

(22) Filed: Feb. 14, 2013

(65) Prior Publication Data

US 2014/0021545 A1    Jan. 23, 2014

Related U.S. Application Data

(60) Provisional application No. 61/672,510, filed on Jul. 17, 2012.

(51) Int. Cl.
*H01L 21/336* (2006.01)

(52) U.S. Cl.
USPC .... 438/289; 438/231; 257/402; 257/E21.618; 257/E29.269

(58) Field of Classification Search
CPC ............... H01L 129/7833; H01L 21/26506; H01L 21/2686

USPC ................. 438/289, 231; 257/402, E21.618, 257/E29.269

See application file for complete search history.

(56) References Cited

U.S. PATENT DOCUMENTS

| | | | |
|---|---|---|---|
| 6,822,297 B2 | 11/2004 | Nandakumar et al. | |
| 6,847,089 B2 | 1/2005 | Chakravarthi et al. | |
| 2004/0061187 A1* | 4/2004 | Weber et al. | 257/408 |
| 2006/0081925 A1* | 4/2006 | Wang et al. | 257/344 |

* cited by examiner

*Primary Examiner* — Caridad Everhart
(74) *Attorney, Agent, or Firm* — Wade J. Brady, III; Frederick J. Telecky, Jr.

(57) ABSTRACT

A method of fabricating a Metal-Oxide Semiconductor (MOS) transistor includes providing a substrate having a substrate surface doped with a second dopant type and a gate stack over the substrate surface, and a masking pattern on the substrate surface which exposes a portion of the substrate surface for ion implantation. A first pocket implantation uses the second dopant type with the masking pattern on the substrate surface. At least one retrograde gate edge diode leakage (GDL) reduction pocket implantation uses the first dopant type with the masking pattern on the substrate surface. The first pocket implant and retrograde GDL reduction pocket implant are annealed. After annealing, the first pocket implant provides first pocket regions and the retrograde GDL reduction pocket implant provides an overlap with the first pocket regions to form a first counterdoped pocket portion within the first pocket regions.

20 Claims, 4 Drawing Sheets

POCKET COUNTERDOPING FOR GATE-EDGE DIODE LEAKAGE REDUCTION

CROSS REFERENCE TO RELATED APPLICATIONS

This application claims the benefit of Provisional Application Ser. No. 61/672,510 entitled "SELF-ALIGNED GATE-EDGE DIODE LEAKAGE REDUCTION IMPLANT", filed Jul. 7, 2012, which is herein incorporated by reference in its entirety.

FIELD

Disclosed embodiments relate to semiconductor fabrication, more particularly to pocket (or halo) implantation and pocket regions for gate edge diode leakage reduction of Metal-Oxide Semiconductor (MOS) transistors.

BACKGROUND

For high-performance complementary MOS (CMOS) transistors, channel profile and source/drain extension (lightly doped drain (LDD)) engineering may be used. Lowering band-to-band (B2B) gate edge diode leakage (GDL) which results in off-state current leakage is a challenge particularly for low leakage (e.g., ultra-low-leakage (ULL)) high voltage threshold (HVT) MOS transistors. Self-aligned pockets (or halos) using the gate stack for self-alignment implanted around the LDDs can improve GDL, with higher angle pocket implants resulting in lower GDL. However, the typical pocket implant angle is limited to about 20 to 30 degrees because of blocking by protruding masking photoresist and/or the adjacent gate electrode (e.g., a polysilicon gate).

SUMMARY

Disclosed embodiments describe methods of fabricating Metal-Oxide Semiconductor (MOS) transistors, and MOS transistors and integrated circuits (ICs) therefrom, including fabrication methods using two or more self-aligned pocket implants using the same mask pattern. A first pocket implant of a second dopant type (e.g., B for NMOS) provides first pocket regions, and a second pocket implant provides counter-doping by implanting with the first dopant type (e.g., arsenic (As) or antimony (Sb) for NMOS) which partially overlaps the first pocket region, creating regions of lower net doping and lower electric (E) field. The regions of lower net doping and lower E field are close enough to the source and drain extension (LDD) regions and source/drain (S/D) junctions to lower gate edge diode leakage (GDL) without intruding into the channel region of the MOS transistor, thus not significantly impacting the threshold voltage (Vt) or sub-threshold leakage of the MOS transistor. Disclosed additional pocket implants are thus referred to herein in "self-aligned GDL reduction pocket implants" or "GDL reduction pocket implants" which form retrograde GDL reduction regions.

BRIEF DESCRIPTION OF THE DRAWINGS

Reference will now be made to the accompanying drawings, which are not necessarily drawn to scale, wherein.

DETAILED DESCRIPTION

Figure 1A:
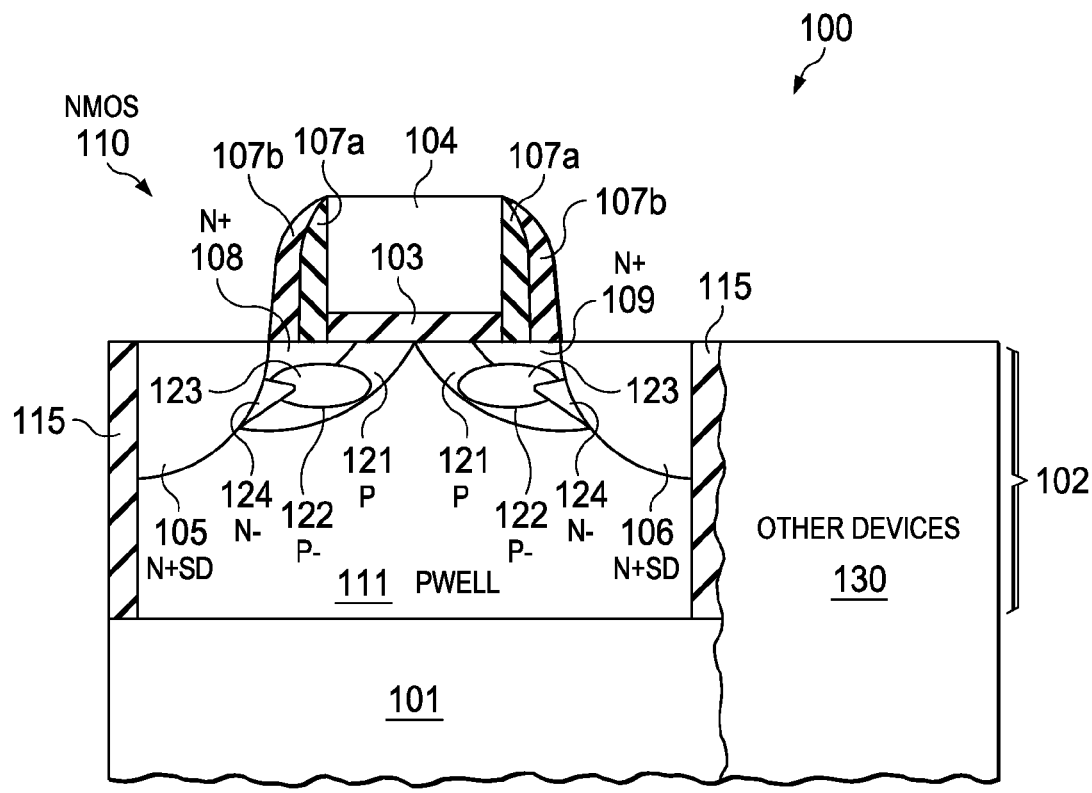
FIG. 1A is a cross-section view of a portion of an IC showing an NMOS transistor after completion of doping and annealing using a fabrication method including two or more self-aligned GDL reduction pocket implants, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A is a cross-section view of a portion of an IC 100 including a MOS transistor shown as an NMOS transistor 110 (NMOS 110) after completion of doping and annealing using fabrication method including two or more self-aligned GDL reduction pocket implants, according to an example embodiment. Although NMOS 110 is shown, disclosed MOS transistors can be PMOS as well, as well as both disclosed NMOS and PMOS transistors on a CMOS IC or on a BiCMOS IC. IC 100 comprises a substrate 101 having a substrate surface 102 which can be a single-crystal silicon substrate doped n-type. However, the substrate 101 may be doped p-type, or may be an epitaxial (e.g., silicon) layer on a single-crystal substrate.

NMOS 110 is shown formed in a pwell 111 (p-type for NMOS 110 is referred to as the second dopant type) that is implanted and/or diffused into the substrate surface 102. A gate stack comprising gate dielectric layer 103 with a gate electrode 104 thereon is on the top surface of the pwell 111. NMOS 110 also includes an N+ doped (n-type for NMOS 110 may be referred to as the first doping type) source 105, and an N+ doped drain 106.

The gate dielectric layer 103 can comprise silicon oxide, nitrogen doped silicon dioxide, silicon oxy-nitride, hafnium oxide, layers of silicon dioxide and silicon nitride, or other electrically insulating material, such as being 1 to 3 nanometers thick. Gate electrode 104 can comprise polycrystalline silicon doped n-type (or doped p-type for PMOS) with a silicide formed on top, or a metal or metal compound such as titanium, tungsten, TiN, tantalum, or TaN for replacement metal gate embodiments. In addition, NMOS 110 has spacers 107a and 107b on the sidewalls of the gate stack 104, 103. LDD extensions include a source extension (LDD) 108, and a drain extension (LDD) 109, both doped n-type for NMOS.

NMOS 110 is shown electrically insulated from other devices 130 including other active devices on the IC 100 by a shallow trench isolation structure (STI) 115 formed within the substrate surface 102. However, any conventional isolation structure may be used such as field oxidation regions (also known as (LOCal Oxidation of Silicon (LOCOS) regions) or implanted isolation regions.

NMOS 110 includes a first pocket distribution of p-type dopant providing conventional first pocket regions 121 shown extending to the surface of the pwell 111 under the gate dielectric layer 103. NMOS 110 also includes at least one retrograde GDL reduction distribution of n-type dopant providing retrograde GDL reduction pocket regions 122. The retrograde GDL reduction pocket regions 122 include an overlap with the first pocket regions 121 to form a first counterdoped pocket portion shown as p− counterdoped pocket portion 123 and n− counterdoped pocket portion 124. N− counterdoped pocket portion 124 is shown dopant type inverted, where a concentration of the n-type dopant type exceeds the concentration p-type dopant provided by first pocket regions 121 plus pwell 111. N− counterdoped pocket portion 124 provides one side and p− counterdoped pocket portion 123 the other side of the buried n−/p− regions shown in FIG. 1A.

The retrograde GDL reduction pocket regions 122 can be seen to create local regions of lower net doping and thus lower E field, thereby reducing the sub-surface band-to-band tunneling near the LDD 108, 109 and N+ S/D 105, 106 junctions, leading to a substantial reduction in the GDL. Additionally, the buried n−/p− regions are localized below the LDD and S/D junctions and do not intrude into the channel region of the NMOS 110, minimizing the impact to the Vt and subthreshold (source) leakage of NMOS 110. Due to the minimized Vt impact, the on-state performance of NMOS 110 is maintained while the total leakage of NMOS 110, which is a sum of the GDL, gate leakage and source leakage, is reduced.

Regarding the fabrication method described in more detail below, the n-type dopant (e.g., As or Sb) which forms retrograde GDL reduction pocket regions 122 for NMOS 110 may be implanted at any angle, such as at the same or a smaller angle compared to pocket implant used to form first pocket regions 121. The retrograde implant of N type dopant can share the same LDD mask as the pocket implants and also be self-aligned to the gate edge of the gate stack 104, 103. The offset spacers 107a can be formed before or after the pocket implants. The p-type pocket dose to form first pocket regions 121 can be adjusted (typically a slightly higher dose) to provide the same Vt that would be obtained without the retrograde GDL reduction pocket regions 122.

Figure 1B:
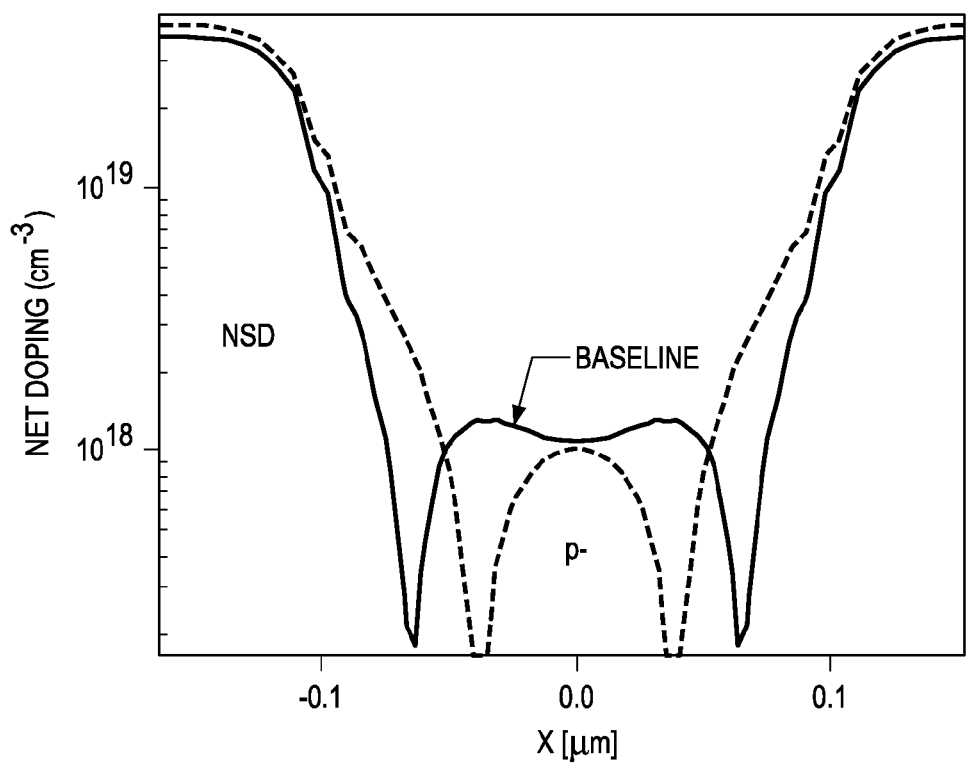
FIG. 1B shows a simulated net doping distribution as a function of distance for an example NMOS transistor along a horizontal slice in the channel direction.
Figure 1C:
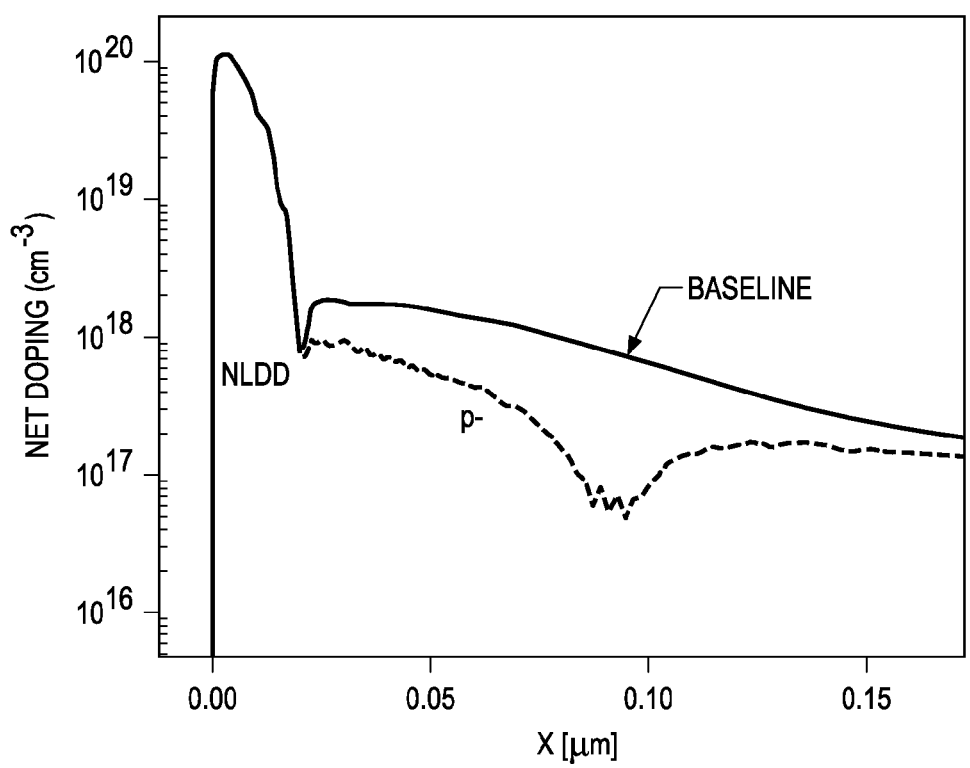
FIG. 1C is a simulated net doping distribution along a vertical slice under the NLDD as a function of distance, both after completion of fabrication.

FIG. 1B shows a simulated net doping distribution as a function of distance for an example NMOS transistor along a horizontal slice in the channel direction 20 nm below the substrate surface 102, and FIG. 1C a simulated net doping distribution along a vertical slice under the NLDD 15 nm from the edge of the gate as a function of distance. The simulations were Technology Computer Aided Design (TCAD) simulations obtained after completion of fabrication and the associated annealing steps that diffuse dopant resulting in the first pocket regions 121 and retrograde GDL reduction pocket regions 122 for NMOS 110 shown in FIG. 1A. These simulations evidence creation of more graded LDD and S/D junctions resulting from adding a disclosed self-aligned GDL reduction pocket implant to form retrograde GDL reduction pocket regions 122 as compared to the junctions resulting from a baseline process using a single pocket implant. As described above, the graded junction shown lowers the GDL current and can be obtained while maintaining the same threshold voltage Vt.

Figure 2:
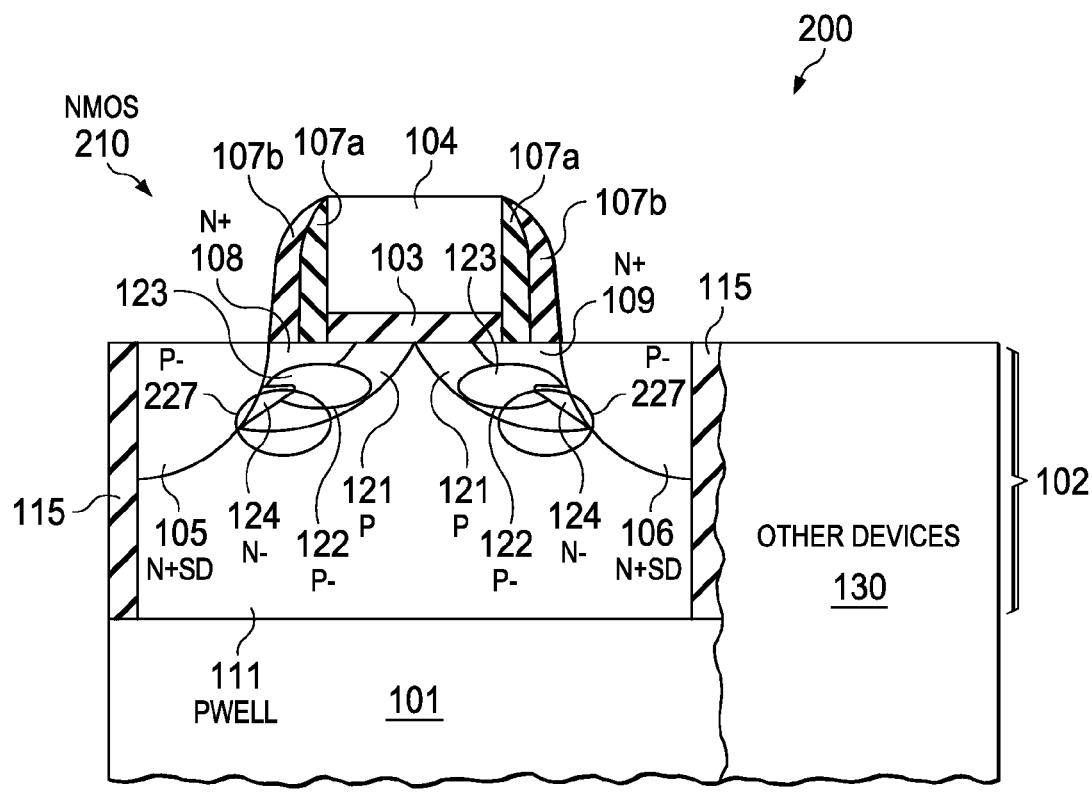
FIG. 2 is a cross-section view of a portion of an IC showing an NMOS transistor after completion of doping and annealing using a fabrication method including dual retrograde GDL reduction pocket implants, according to an example embodiment.

FIG. 2 is a cross-section view of a portion of an IC 200 showing a MOS transistor shown as NMOS 210 after completion of doping and annealing using a fabrication method including dual retrograde GDL reduction pocket implants, according to an example embodiment. NMOS 210 includes the retrograde GDL reduction pocket regions 122 shown in FIG. 1A along with second GDL reduction pocket regions 227, each including n-type dopant, such as provided by implanting As and/or Sb. Second GDL reduction pocket regions 227 are shown extending below the first pocket regions 121.

One of the GDL reduction pocket implants can be performed at an angle similar to pocket angle used to form first pocket regions 121, and another GDL reduction pocket implant to form second GDL reduction pocket regions 227 can be performed at smaller angle and higher energy. As described above, disclosed retrograde GDL reduction regions create local regions of lower net doping and thus lower E field, at the LDD 108, 109, and N+ S 105/D 106 junctions for NMOS, and being retrograde do not intrude into the channel of the transistor significantly to minimize the effect to Vt and subthreshold (source) leakage. Lowering the E field at the LDD and S/D junctions results in a reduction of GDL and total transistor leakage, which in turn reduces the standby power consumption of the IC. The p-type pocket dose used to form first pocket regions 121 for NMOS (or n-type dopant for PMOS) can be adjusted (typically a slightly higher dose) to obtain the same Vt that would be obtained without retrograde GDL reduction pocket regions, such as retrograde GDL reduction pocket regions 122 and 227 for NMOS.

Figure 3:
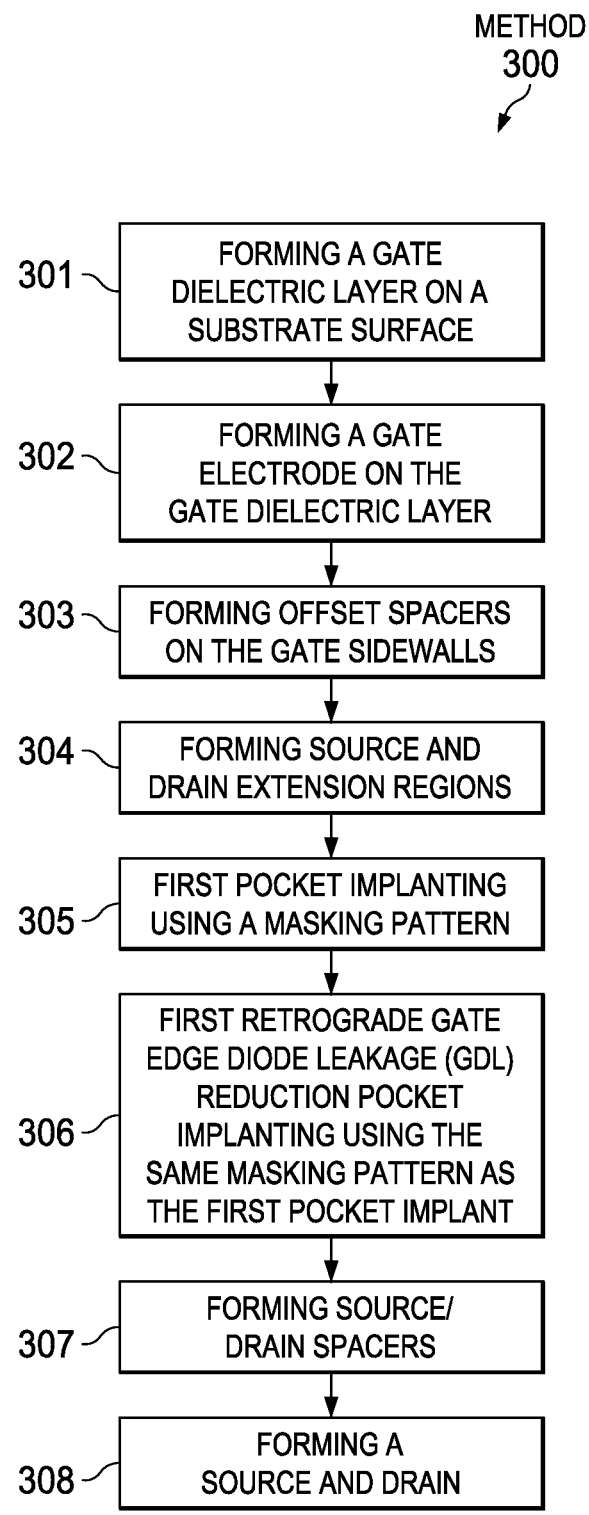
FIG. 3 is a flow chart that shows steps in an example method for forming MOS transistors including two or more self-aligned GDL reduction pocket implants using the same mask pattern, according to an example embodiment.

FIG. 3 is a flow chart that shows steps in an example method 300 for forming MOS transistors including two or more self-aligned pocket implants using the same mask pattern, according to an example embodiment. Step 301 comprises formation of the gate dielectric. A gate dielectric layer 103, such as silicon oxide, an oxynitride, silicon nitride, barium strontium titanate (BST), Lead Zirconate Titanate (PZT), a silicate, any other high-k material, or any combination or stack thereof, is formed on a substrate 101 having a substrate surface 102 (or an optional well formed in the substrate surface).

Step 302 comprises forming a gate electrode 104, such as comprised of polycrystalline silicon doped p-type for PMOS and n-type for NMOS with an optional silicide formed on top, or a metal or metal compound gate such as titanium, aluminum, tungsten, TiN, TiAlN, tantalum, or TaN is formed on the gate dielectric layer 103. Step 303 comprises forming offset spacers 107a on the gate sidewalls, such as comprised of oxide, a nitride, an oxynitride or a combination or stack thereof, thereby creating an offset space adjacent to the gate stack 104, 103.

Step 304 comprises formation of the LDDs 108, 109. The ordering of this step is only an example as the LDDs 108, 109 may be created either earlier or later in method 300. Implanting a dopant such as arsenic (As) into the substrate surface 102 or well (e.g., pwell 111 in FIG. 1A and FIG. 2) forms the LDDs 108, 109. The presence of offset spacers 107a creates a separation between the LDDs 108, 109 and the gate stacks 104, 103.

The regions of a pocket dopant are now formed. Step 305 comprises a first pocket implant using a masking pattern, which after the annealing steps involved in the completion of method 300 provides first pocket regions 121. This implant is self-aligned to the edge of the gate stack (gate edge). As an example, the first pocket implant dose to form first pocket regions 121 may be of boron for NMOS or phosphorous for PMOS in the range of $1.5 \times 10^{13}$ atoms/cm$^2$ to $6 \times 10^{13}$ atoms/cm$^2$ at an energy level of 1 to 15 KeV for boron, or an energy for other species to obtain the same projected range as boron implanted at 1 to 15 Key. The angle of the first pocket implant relative to a normal to the substrate surface 102 is generally 10 to 30 degrees. As described above, the first pocket implant dose can be adjusted (typically a higher dose) to obtain the same Vt as the Vt resulting from a conventional single pocket dose without the retrograde GDL reduction pocket ion implant(s) in step 306 described below.

Step 306 comprises a first retrograde GDL reduction pocket implant using the same masking pattern as the first pocket implant, which after completion of method 300 becomes retrograde GDL reduction pocket regions 122, including n-type dopant for NMOS, such as provided by implanting As or Sb. This implant is also self-aligned to the edge of the gate stack (gate edge). As an example, the first retrograde GDL reduction pocket implant can be of As or Sb for NMOS, or indium (In) for PMOS, in a dose range of $2 \times 10^{13}$ atoms/cm$^2$ to $8 \times 10^{13}$ atoms/cm$^2$ at an energy level of 15 to 120 keV for As, or an energy for other species to obtain the same projected range as As at 15 to 120 keV. The angle of the first retrograde GDL reduction pocket implant relative to a normal to the substrate surface 102 is generally 0 to 30 degrees, and can be the same angle or similar angle (e.g., within ±10 degrees) as used for the first pocket implant (step 305).

An optional second retrograde GDL reduction pocket implant using the same masking pattern as the first pocket implant and first retrograde GDL reduction pocket implant forms what after completion of method 300 becomes retrograde GDL reduction pocket regions 227. As with the first retrograde GDL reduction pocket implant, for the second retrograde GDL reduction pocket implant for NMOS, an n-type dopant can be provided by implanting As or Sb, or for PMOS by implanting In. This implant is also self-aligned to the edge of the gate stack (gate edge). The second retrograde GDL reduction pocket implant is generally designed to be in a different part of the energy/dose range designed for the first pocket compensating implant, with the energy for second retrograde GDL reduction pocket implant selected to generally provide a deeper projected range as compared to the projected range of the first retrograde GDL reduction pocket implant.

As an example, for second retrograde GDL reduction pocket implant dose can be in a dose range from $2 \times 10^{13}$ atoms/cm$^2$ to $8 \times 10^{13}$ atoms/cm$^2$ at an energy of 70 to 140 keV for As in the case of NMOS, or an energy for other species (Sb for NMOS or In for PMOS) to obtain the same projected range as As at 70 to 140 keV. The angle of the second retrograde GDL reduction pocket implant relative to a normal to substrate surface 102 is generally at a smaller angle as compared to the angle of the first pocket implant and the first retrograde GDL reduction pocket implant, such as 15 degrees, 20 degrees, and 20 degrees respectively, in one particular embodiment.

The method can further comprise implanting at least one of fluorine, nitrogen and carbon "co-implants" using the same masking pattern as the pocket implants. Si or Ge may also be used as co-implant species. The co-implant dose (e.g., fluorine) may be in the range of $5 \times 10^{13}$ atoms/cm$^2$ to $1 \times 10^{15}$ atoms/cm$^2$. However, any level of co-implant may generally be used. The co-implant energy is selected to implant the co-implant species to approximately the same depth as the pocket dopants. The co-implant can precede steps 305 and 306. It is noted the ordering of the steps 305 and 306 is by example since the pocket implants may be created either earlier or later in the process.

Step 307 is the formation of the source/drain spacers, such as spacers 107b shown in FIG. 1A. The source/drain spacers 107b can comprise an oxide/nitride stack, but alternatively can comprise an oxide, a nitride, an oxynitride, or any suitable material. The presence of source/drain spacers 107b acts to create a separation between the source/drain extension regions and source or drain regions, such as LDDs 108, 109 and the N+ source 105 or N+ drain 106 for NMOS.

Step 308 is the formation a source and drain, such as N+ source 105 and N+ drain 106 for NMOS. For NMOS, a dopant such as As and/or Phosphorus is implanted into the substrate surface 102 at the source region and the drain region. The presence of source/drain spacers 107b creates the proper separation between the LDDs 108, 109 and the N+ source and drain 105, 106. Co-implants such as nitrogen, and/or carbon and/or fluorine may be implanted along with the source/drain dopants.

An annealing step follows. Annealing provides high temperature thermal process conditions sufficient to cause the dopants in the source, drain, LDD and pocket regions (121, 122 and 227 (if present) for NMOS) to be activated and to diffuse. The result is that there is the desired concentration profile of pocket dopants, for NMOS being the first pocket regions 121 relative to the LDD 108, 109 junctions and in the channel region near the gate dielectric layer 103, and desirable concentration profile of retrograde GDL reduction pocket regions 122 (and optionally also GDL reduction pocket regions 227) to lower the E field at the LDDs 108, 109, and N+ S 105/D 106 junctions thus lowering the GDL and total leakage of the MOS transistor. The manufacturing process continues generally through conventional back end of the line (BEOL) processing including multi-layer metallization and passivation until the final structure of the IC is completed.

EXAMPLES

Disclosed embodiments are further illustrated by the following specific Examples, which should not be construed as limiting the scope or content of this Disclosure in any way.

Figure 4A:
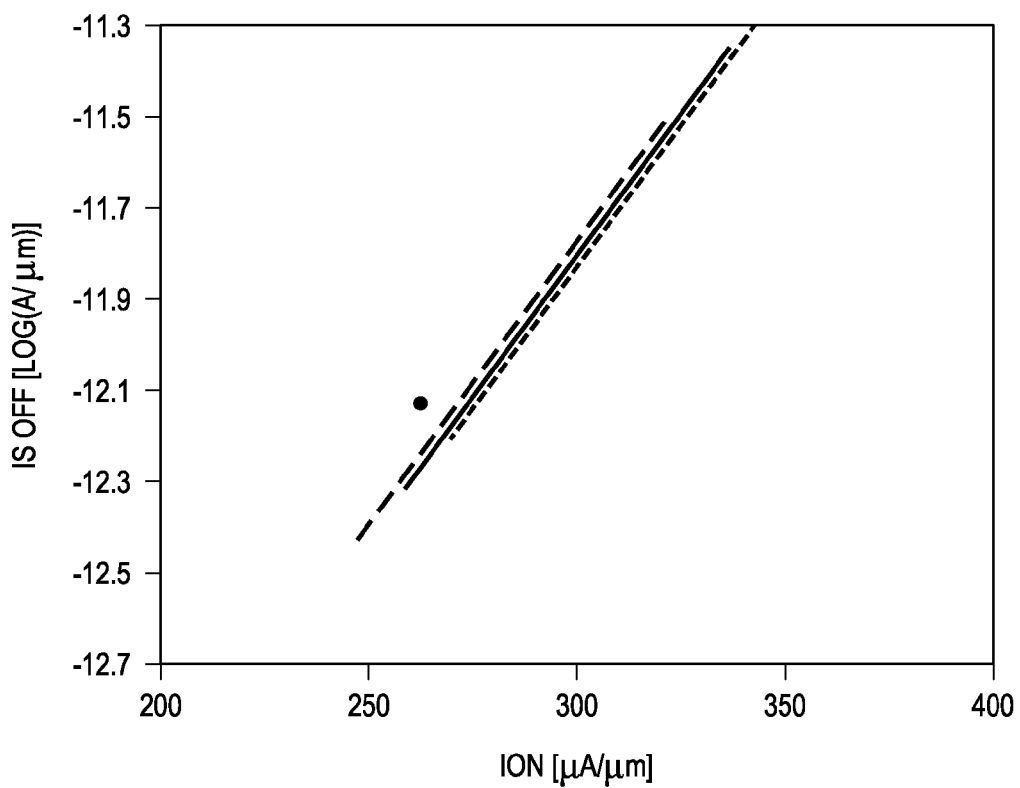
FIG. 4A shows results from simulated off-state source leakage ($IS_{Off}$) vs. Ion (Ids) for an example NMOS transistor analogous the NMOS transistor shown in FIG. 1A, along with the results from an NMOS transistor from a baseline process without a first retrograde GDL reduction pocket implant.

FIG. 4A shows results from simulated off-state source leakage (IS$_{Off}$) vs. Ion (Ids) for an example NMOS transistor analogous to NMOS 110 in FIG. 1A, where the first retrograde GDL reduction pocket implant was an As implant $3 \times 10^{13}$ cm$^{-2}$ at 25 keV at a 30 deg tilt, along with the results from an NMOS transistor from a baseline (BL, control) process without an As first retrograde GDL reduction pocket implant. All devices received a boron first pocket implant (dose $5.6 \times 10^{13}$ cm$^{-2}$, energy of 10 keV, at an angle of 30 deg). For all devices the NLDD implant was at a dose of $8 \times 10^{14}$ cm$^{-2}$ at an energy of 2 keV. An improvement of about 3% in IS$_{Off}$ can be seen for the example NMOS transistor compared to the baseline NMOS transistor.

Figure 4B:
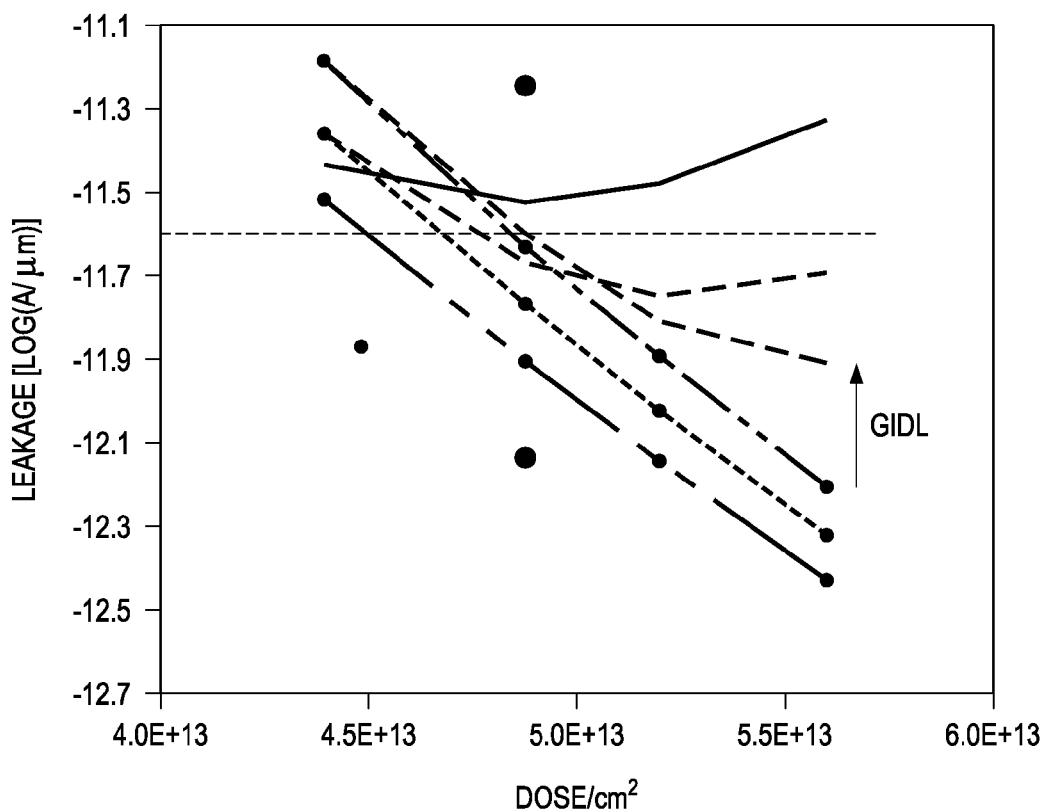
FIG. 4B shows results from simulated off-state leakage (lower three curves are source leakage $IS_{Off}$, and the upper three curves are drain leakage $ID_{Off}$) vs. boron first pocket implant dose for the example NMOS transistor and baseline NMOS transistor described relative to FIG. 4A.

FIG. 4B shows results from simulated off-state leakage (lower three curves are source leakage IS$_{off}$, upper three curves are drain leakage ID$_{Off}$) vs. boron first pocket implant dose for the example NMOS transistor described and baseline NMOS transistor described above relative to FIG. 4A. The example NMOS devices had a first retrograde GDL reduction pocket implant of As at a dose of $3 \times 10^{13}$ cm$^{-2}$, energies of 15, 20, and 25 keV (corresponding to the three curves, with the highest energy case shown producing the lowest ID$_{Off}$), and at a 30 deg tilt. GDL ($ID_{Off}$–$IS_{Off}$) can be seen to be reduced for example NMOS transistors up to 0.6 of a decade at higher pocket doses.

Disclosed embodiments can be integrated into a variety of assembly flows to form a variety of different semiconductor integrated circuit (IC) devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of fabricating a Metal-Oxide Semiconductor (MOS) transistor, comprising:
providing a substrate having a substrate surface doped with a second dopant type, a gate stack over said substrate surface, and a masking pattern on said substrate surface which together with said gate stack exposes a portion of said substrate surface for ion implantation;
implanting a first pocket implant using said second dopant type with said masking pattern on said substrate surface,
implanting at least one retrograde gate edge diode leakage (GDL) reduction pocket implant using a first dopant type with said masking pattern on said substrate surface, and
annealing said first pocket implant and said retrograde GDL reduction pocket implant,
wherein after said annealing said first pocket implant provides first pocket regions and said retrograde GDL reduction pocket implant provides an overlap with said first pocket regions to form a first counterdoped pocket portion within said first pocket regions.

2. The method of claim 1, wherein said first counterdoped pocket portion includes a type inverted region where a concentration of said first dopant type exceeds a concentration of said second dopant type.

3. The method of claim 1, wherein said retrograde GDL reduction pocket implant is performed at an angle relative to a normal to said substrate surface that is less than or equal to (≤) an angle relative to said normal used by said first pocket implant.

4. The method of claim 1, wherein said MOS transistor is an NMOS transistor and a dopant species for said retrograde GDL reduction pocket implant is arsenic or antimony.

5. The method of claim 1, wherein said MOS transistor is a PMOS transistor and a dopant species for said retrograde GDL reduction pocket implant is indium.

6. The method of claim 1, further comprising implanting a second retrograde GDL reduction pocket implant using said masking pattern to form a second counterdoped pocket portion within said first pocket regions.

7. The method of claim 6, wherein said second retrograde GDL reduction pocket implant is performed at a smaller angle relative to a normal to said substrate surface and a higher energy as compared to said first retrograde GDL reduction pocket implant.

8. The method of claim 1, further comprising implanting at least one of fluorine, nitrogen and carbon using said masking pattern.

9. The method of claim 1, further comprising:
forming source/drain regions and lightly doped drain (LDD) extensions to said source/drain regions in said substrate surface both doped with said first dopant type.

10. The method of claim 9, wherein said LDD extensions are formed using said masking pattern.

11. A Metal-Oxide Semiconductor (MOS) transistor, comprising:
a substrate having a substrate surface doped with a second dopant type;
source/drain regions and lightly doped drain (LDD) extensions to said source/drain regions formed in said substrate surface both doped with a first dopant type,
a gate stack over said substrate surface;
a first pocket distribution of said second dopant type providing first pocket regions, and
at least one retrograde gate edge diode leakage (GDL) reduction distribution of said first dopant type providing retrograde GDL reduction regions,
wherein said retrograde GDL reduction regions include an overlap with said first pocket regions to form a first counterdoped pocket portion within said first pocket regions.

12. The MOS transistor of claim 11, wherein said MOS transistor is an NMOS transistor and a dopant species for said retrograde GDL reduction regions is arsenic or antimony.

13. The MOS transistor of claim 11, wherein said MOS transistor is a PMOS transistor and a dopant species for said retrograde GDL reduction regions is indium.

14. The MOS transistor of claim 11, wherein said first counterdoped pocket portion includes a type inverted region where a concentration of said first dopant type exceeds a concentration of said second dopant type.

15. The MOS transistor of claim 14, wherein said retrograde GDL reduction regions further comprise a second counterdoped pocket portion that extends below said first pocket regions.

16. An integrated circuit (IC), comprising:
a substrate having a substrate surface doped with a second dopant type;
at least one Metal-Oxide Semiconductor (MOS) transistor formed in said substrate surface, including
source/drain regions and lightly doped drain (LDD) extensions to said source/drain regions formed in said substrate surface both doped with a first dopant type,
a gate stack over said substrate surface;
a first pocket distribution of said second dopant type providing first pocket regions, and
at least one retrograde gate edge diode leakage (GDL) reduction distribution of said first dopant type providing retrograde GDL reduction regions,
wherein said retrograde GDL reduction regions include an overlap with said first pocket regions to form a first counterdoped pocket portion within said first pocket regions.

17. The IC of claim 16, wherein said first counterdoped pocket portion includes a type inverted region where a concentration of said first dopant type exceeds a concentration of said second dopant type.

18. The IC of claim 16, wherein said MOS transistor is an NMOS transistor and a dopant species for said retrograde GDL reduction regions is arsenic or antimony.

19. The IC of claim 16, wherein said MOS transistor is a PMOS transistor and a dopant species for said retrograde GDL reduction regions is indium.

20. The IC of claim 16, wherein said retrograde GDL reduction regions further comprise a second counterdoped pocket portion that extends below said first pocket regions.

* * * * *